(12) United States Patent
Chen et al.

(10) Patent No.: US 9,570,990 B2
(45) Date of Patent: Feb. 14, 2017

(54) KNEE VOLTAGE DETECTOR

(71) Applicant: NOVATEK Microelectronics Corp., Hsin-Chu (TW)

(72) Inventors: Ke-Horng Chen, New Taipei (TW); Chao-Chang Chiu, Taoyuan (TW); Hao-Yuan Lin, Taipei (TW); Che-Hao Meng, New Taipei (TW); Chih-Wei Chang, Taichung (TW); Ying-Hsiang Wang, New Taipei (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 79 days.

(21) Appl. No.: 14/715,620

(22) Filed: May 19, 2015

(65) Prior Publication Data

US 2016/0211755 A1    Jul. 21, 2016

(30) Foreign Application Priority Data

Jan. 19, 2015    (TW) .............................. 104101662 A

(51) Int. Cl.
*H02M 3/335*    (2006.01)
*G01R 19/10*    (2006.01)

(52) U.S. Cl.
CPC .......... *H02M 3/33507* (2013.01); *G01R 19/10* (2013.01); *H02M 3/3353* (2013.01)

(58) Field of Classification Search
None
See application file for complete search history.

(56) References Cited

U.S. PATENT DOCUMENTS

| 7,342,812 | B2 * | 3/2008 | Piper | ................. | H02M 3/33523 363/21.11 |
| 7,859,862 | B2 | 12/2010 | Lin | | |
| 8,199,538 | B2 * | 6/2012 | Piper | ................. | H02M 3/33507 363/21.13 |
| 2007/0103134 | A1 | 5/2007 | Yang | | |
| 2009/0290390 | A1 * | 11/2009 | Piper | ................. | H02M 3/33507 363/21.04 |
| 2012/0140531 | A1 * | 6/2012 | Lin | .................... | H02M 3/33507 363/21.12 |
| 2013/0235620 | A1 | 9/2013 | Morris | | |
| 2014/0355314 | A1 * | 12/2014 | Ryan | ................ | H02M 3/33507 363/21.01 |
| 2015/0103566 | A1 * | 4/2015 | Keogh | ............. | H02M 3/33507 363/21.12 |

FOREIGN PATENT DOCUMENTS

TW            201011493         3/2010

* cited by examiner

*Primary Examiner* — Paresh Patel
(74) *Attorney, Agent, or Firm* — Winston Hsu; Scott Margo

(57) ABSTRACT

A knee voltage detector for a flyback converter is provided. The knee voltage detector comprises a delay unit, for delaying an auxiliary related voltage for a specific period, to generate a delay signal; a subtracting unit, for generating a subtraction signal according to the auxiliary related voltage and the delay signal; a comparing unit, for generating a sampling signal when the subtraction signal indicates that a voltage difference between the auxiliary related voltage and the delay signal is greater than a threshold; and a sample and hold unit, for sampling the delay signal to generate a knee voltage according to the sampling signal when the voltage difference between the auxiliary related voltage and the delay signal is greater than the threshold.

7 Claims, 7 Drawing Sheets

KNEE VOLTAGE DETECTOR

BACKGROUND OF THE INVENTION

1. Field of the Invention

The present invention relates to a knee voltage detector for a flyback converter, and more particularly, to a knee voltage detector capable of comparing an auxiliary related voltage of an auxiliary winding and a delay signal thereof on a primary side, to accurately detect a knee voltage.

2. Description of the Prior Art

A switching power converter can convert high voltage AC or DC power into low voltage DC power, and is widely used in all kinds electronic devices as a power supply. Common structures of the switching power converters include a flyback structure, a structure forward structure and a Push-Pull structure.

In general, a power converter can adjust a duty of a pulse width modulation (PWM) by detecting a magnitude of an output voltage, to generate the output voltage stably. Methods of detecting the output voltage can be divided into a secondary side feedback control structure which directly detects the output voltage and a primary side feedback control structure which indirectly detects the output voltage. On the primary side feedback control structure, a transformer of a power converter includes a primary side winding and a secondary side winding, and also includes an auxiliary winding on a primary side, and does not have to include an optical coupler and a three-terminal shunt regulator on a secondary side. When a current flows through the secondary side winding, the auxiliary winding can by induced by variations of the output voltage of the power converter. Therefore, a PWM control unit of the power converter can generate a feedback signal according to a voltage signal on the auxiliary winding, and then generates a control signal accordingly, to control a duty of a transistor and thus adjust electrical power for a load. Since the optical coupler and the three-terminal shunt regulator require high cost and large circuit area, the primary side feedback control structure can effectively reduce cost of the power converter.

In detail, please refer to FIG. 1A, which is a schematic diagram of a primary side control flyback circuit 10. As shown in FIG. 1A, compared with a secondary side feedback control structure, the primary side control flyback circuit 10 does not include a feedback network on a secondary side for directly detecting an output voltage $V_{OUT}$, and thus needs to detect an auxiliary voltage $V_A$ of an auxiliary winding $N_A$ on a primary side (this structure detects an auxiliary related voltage $V_{AUX}$ to observe the auxiliary voltage $V_A$, and the auxiliary related voltage $V_{AUX}$ is a divided voltage of the auxiliary voltage $V_A$), to indirectly detect the output voltage $V_{OUT}$, so as to generate a control signal $V_{GD}$ to control a duty of the transistor 100 for outputting the voltage $V_{OUT}$ stably.

Under this structure, please refer to FIG. 1B, which is a schematic diagram of signals of the primary side control flyback circuit 10 shown in FIG. 1A. As shown in FIG. 1A and FIG. 1B, after the control signal $V_{GD}$ controls the transistor 100 to turn on to charge a primary side winding $N_P$ and a secondary side winding $N_S$ for a charging period $T_{ON}$, the control signal $V_{GD}$ controls the transistor 100 to turn off and enter a discharging period $T_{OFF}$. At this moment, via electromagnetic induction of the transformers (i.e. the auxiliary winding $N_A$ and the secondary side winding $N_S$) the auxiliary voltage $V_A$ of the auxiliary winding $N_A$ can be induced by a secondary side voltage $V_S$ of the secondary side winding $N_S$ to observe information about the output voltage $V_{OUT}$ (in this structure, a primary side control circuit 102 detects the auxiliary related voltage $V_{AUX}$ of a divided voltage of the auxiliary voltage $V_A$ to observe information about the auxiliary voltage $V_A$ and the output voltage $V_{OUT}$, wherein the auxiliary related voltage $V_{AUX}$ is equal to the auxiliary voltage $V_A$ multiplying a resistor ratio k of a divided voltage resistor).

However, the auxiliary voltage $V_A$ is interfered by many non-ideal factors, and cannot correctly reflect the output voltage $V_{OUT}$. For example, in a voltage across a diode $D_1$ on the secondary side varies with a discharging current $I_S$ on the secondary side (i.e. a falling effect), and a resonant effect occurs at the moment that the discharging current $I_S$ on the secondary side falls to 0. Therefore, in order to accurately detect the output voltage $V_{OUT}$, the primary side control circuit 102 detects a knee voltage $V_C$ of the auxiliary voltage $V_A$ at the moment that the discharging current $I_S$ on the secondary side falls to 0, and then adjusts the output voltage $V_{OUT}$ accordingly via the control signal $V_{GD}$ (at this moment, the knee voltage $V_C$ is not interfered by the above falling effect and resonant effect.

For example, please refer to FIG. 2, which is a schematic diagram of operations of a conventional detector of the primary side control circuit 102 shown in FIG. 1A. As shown in FIG. 2, for a detector of U.S. Pat. No. 7,859,862, in order to prevent the interfered auxiliary voltage $V_A$ from being stored by a sampling circuit, a blanking circuit generates a blanking period first, to prevent the signal interfered by non-ideal factors when power elements are switched from being sampled. In such a situation, after the blanking period (from a time point A to a time point B), since the auxiliary voltage $V_A$ has a significant slope variation at the moment that the discharging current $I_S$ falls to 0 and a voltage at the moment can be sampled as the knee voltage $V_C$, a differential circuit detects a slope variation of the auxiliary voltage $V_A$, and a sampling circuit samples a delay voltage Vd of the auxiliary voltage $V_A$ to obtain the knee voltage $V_C$ when the slope variation exceeds a threshold value, wherein a delay time between the auxiliary voltage $V_A$ and the delay voltage Vd can be designed as a reacting time of the detector (i.e. from a time point of detecting a slope alteration exceeding the threshold value to a time point C of sampling the delay voltage Vd), to accurately sample the voltage at the moment that the slope alteration of the auxiliary voltage $V_A$ exceeds the threshold value as the knee voltage $V_C$.

However, since a slope of the auxiliary voltage $V_A$ is effected by elements outside the system, accuracy of the detecting system is effected by external elements, and thus the system cannot be widely applied (e.g. a discharging slope of the discharging current $I_S$ is effected by the output voltage $V_{OUT}$ and the load and thus effect the falling slope of the auxiliary voltage $V_A$, such that different conditions have different slope variations at the moment that the discharging current $I_S$ falls to 0).

On the other hand, please refer to FIG. 3, which is a schematic diagram of operations of another conventional detector of the primary side control circuit 102 shown in FIG. 1A. As shown in FIG. 3, for a detector of US 2007/0103134, a multi-sampling method is applied to repetitively sample the auxiliary voltage $V_A$. When a target of the knee voltage $V_C$ occurs, a sampling result is outputted. In detail, a blanking circuit generates a blanking time $T_d$ first, and the detector does not perform detection during the blanking time $T_d$, to avoid sampling signal affected by non-ideal factors. After the blanking time $T_d$, a counter sends out the sampling signals $V_{SPN}$ $V_{SP1}$ according to a sampling frequency, to control a sampling circuit to sample the auxiliary voltage $V_A$ accordingly until a sampled voltage of the auxiliary voltage $V_A$ have a significant variation, and then take a previous sampled voltage as the knee voltage $V_C$.

However, accuracy of the above detector of degree is significantly limited by the sampling frequency. In order to increase system accuracy, the sampling frequency needs to be increased, thereby increasing power consumption and inducing electromagnetic interference.

Therefore, the conventional secondary side feedback control structure includes the optical coupler and the three-terminal shunt regulator, and thus requires high cost and large circuit area, while accuracy of the conventional primary side feedback control structure is effected by external elements otherwise the sampling frequency needs to be increased, thereby increasing power consumption and inducing electromagnetic interference. Thus, there is a need for improvement of the prior art.

SUMMARY OF THE INVENTION

It is therefore an objective of the present invention to provide a knee voltage detector capable of comparing an auxiliary related voltage of an auxiliary winding and a delay signal thereof on a primary side, to accurately detect a knee voltage.

A knee voltage detector for a flyback converter is provided. The knee voltage detector comprises a delay unit, for delaying an auxiliary related voltage of an auxiliary winding of the flyback converter for a specific period, to generate a delay signal; a subtracting unit, for generating a subtracting signal according to the auxiliary related voltage and the delay signal; a comparing unit, for generating a sampling signal when the subtracting signal indicates that a voltage difference between the auxiliary related voltage and the delay signal is greater than a threshold value; and a sample and hold unit, for sampling the delay signal to generate a knee voltage according to the sampling signal when the voltage difference between the auxiliary related voltage and the delay signal is greater than the threshold value.

These and other objectives of the present invention will no doubt become obvious to those of ordinary skill in the art after reading the following detailed description of the preferred embodiment that is illustrated in the various figures and drawings.

DETAILED DESCRIPTION

Figure 4:
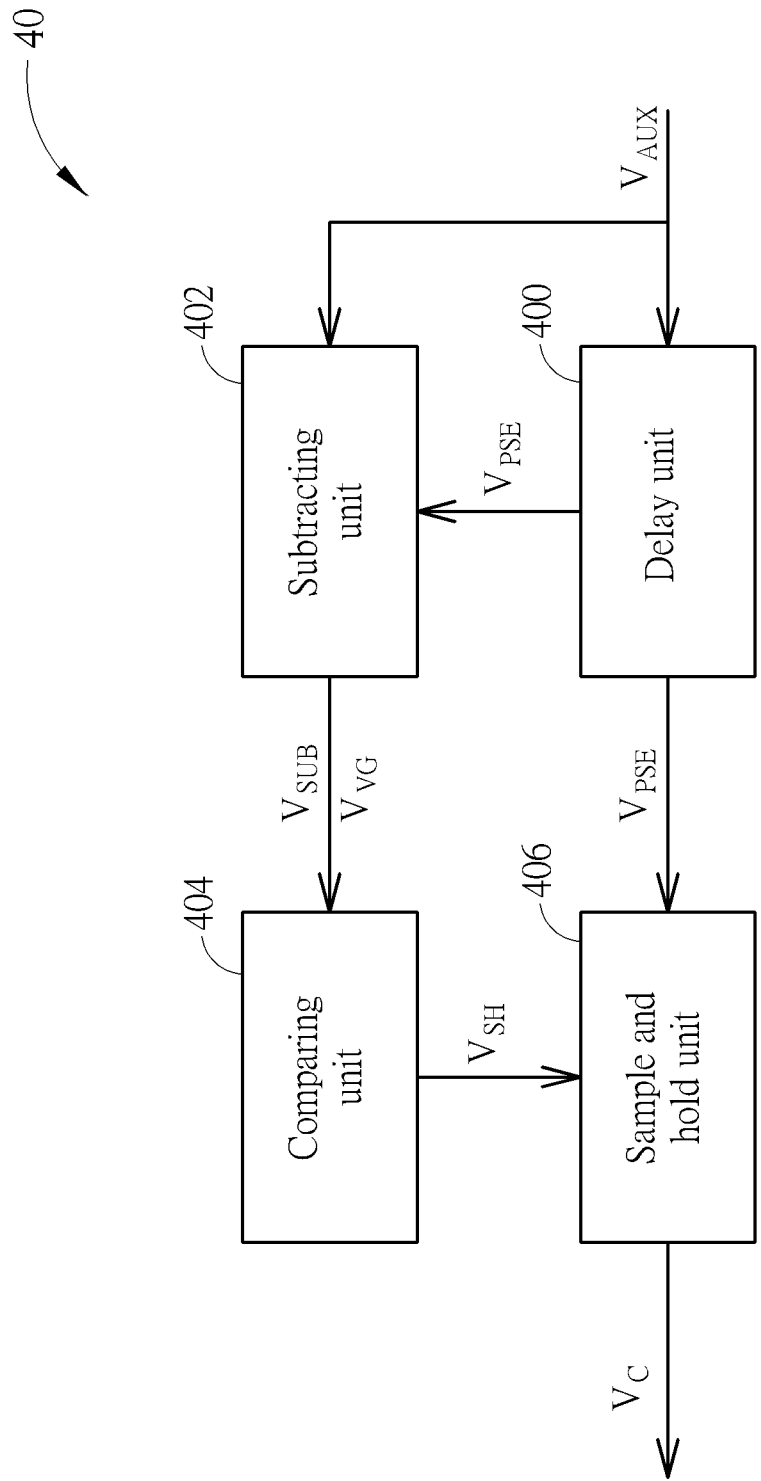
FIG. 4 is a schematic diagram of a knee voltage detector according to an embodiment of the present invention.

Please refer to FIG. 4, which is a schematic diagram of a knee voltage detector 40 according to an embodiment of the present invention. As shown in FIG. 4, the knee voltage detector 40 can be applied on the primary side control circuit 102 of the primary side control flyback circuit 10, to detect the knee voltage $V_C$. The knee voltage detector 40 comprises a delay unit 400, a subtracting unit 402, a comparing unit 404 and a sample and hold unit 406. In short, the delay unit 400 delays an auxiliary related voltage $V_{AUX}$ of an auxiliary winding $N_A$ of the flyback converter 10 for a specific period, to generate a delay signal $V_{PSE}$. The subtracting unit 402 generates a subtracting signal $V_{SUB}$ according to the auxiliary related voltage $V_{AUX}$ and the delay signal $V_{PSE}$. The comparing unit 404 generates a sampling signal $V_{SH}$ when the subtracting signal $V_{SUB}$ indicates that a voltage difference between the auxiliary related voltage $V_{AUX}$ and the delay signal $V_{PSE}$ is greater than a threshold value. the sample and hold unit 406 samples the delay signal $V_{PSE}$ to generate the knee voltage $V_C$ when the voltage difference between the auxiliary related voltage $V_{AUX}$ and the delay signal $V_{PSE}$ is greater than threshold value according to sampling signal $V_{SH}$.

In such a situation, since the delay signal $V_{PSE}$ and the auxiliary related voltage $V_{AUX}$ only have a small difference value (substantially equal to 0V) before the discharging current $I_S$ falls to 0, and the auxiliary related voltage $V_{AUX}$ varies rapidly due to the resonant effect but the delayed delay signal $V_{PSE}$ does not varies rapidly at the moment that the discharging current $I_S$ falls to 0, the voltage difference between the delay signal $V_{PSE}$ and the auxiliary related voltage $V_{AUX}$ is greater than the predefined threshold value. Therefore, it can be determined that the discharging current $I_S$ is 0 at the moment that the voltage difference between the auxiliary related voltage $V_{AUX}$ and the delay signal $V_{PSE}$ is greater than the threshold value, so as to obtain a voltage of the auxiliary related voltage $V_{AUX}$ at this moment to generate the knee voltage $V_C$ by sampling the delay signal $V_{PSE}$ (the voltage of the auxiliary related voltage $V_{AUX}$ at this moment is equal to the knee voltage $V_C$ multiplying a resistor ratio k of a divided voltage resistor). As a result, the embodiment can compare the auxiliary related voltage $V_{AUX}$ and the delay signal $V_{PSE}$ on a primary side, to accurately detect the knee voltage $V_C$, and thus has lower cost and smaller circuit area compared with the conventional secondary side feedback control structure, and is not effected by external elements or does not need to increase the sampling frequency thereby saving power consumption and avoiding electromagnetic interference compared with the conventional primary side feedback control structure.

Figure 5:
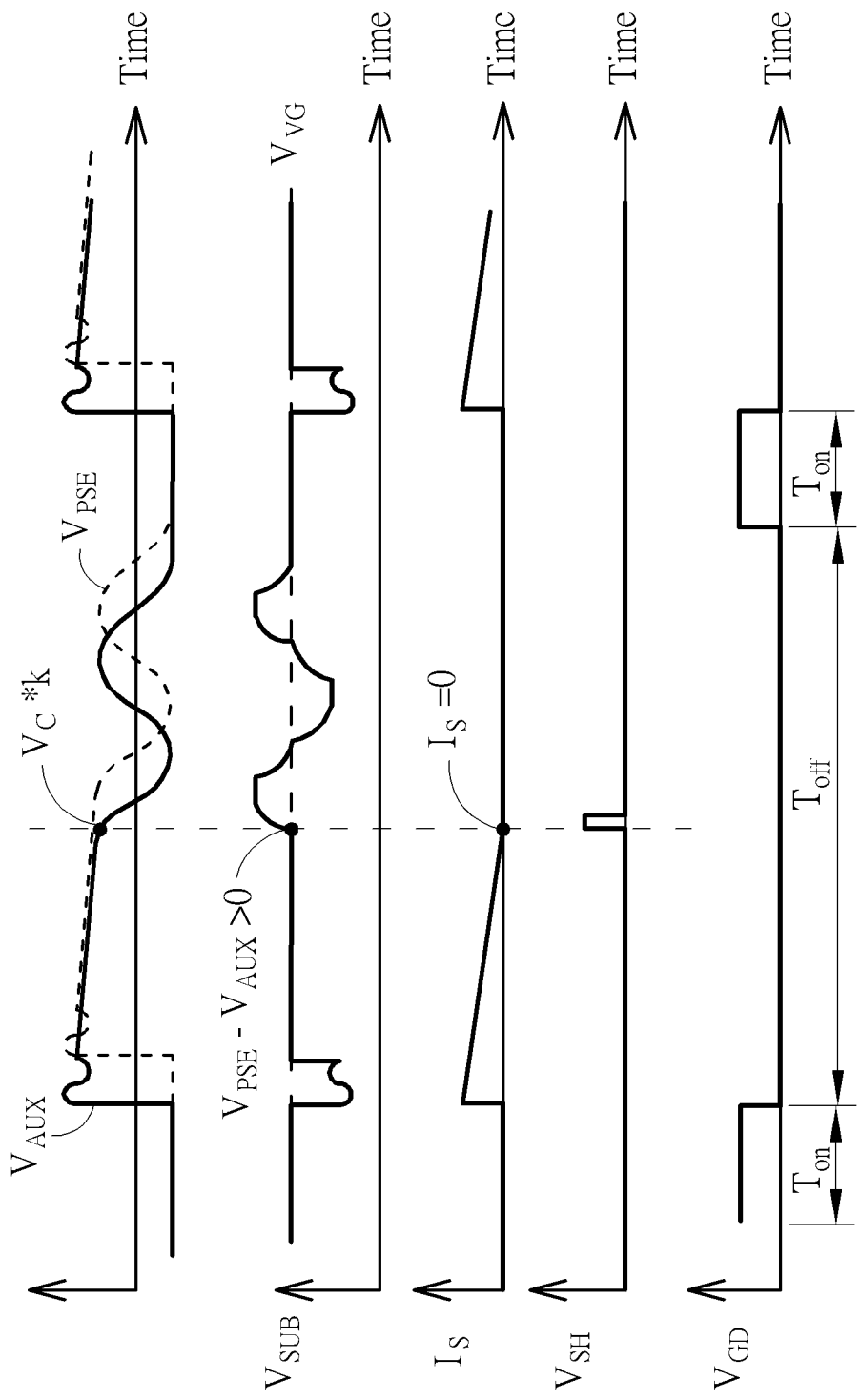
FIG. 5 is a schematic diagram of signals of the knee voltage detector as shown in FIG. 4.

In detail, please refer to FIG. 5, which is a schematic diagram of signals of the knee voltage detector 40 as shown in FIG. 4. As shown in FIG. 5, the delay signal $V_{PSE}$ as shown by a dotted line and the auxiliary related voltage $V_{AUX}$ as shown by a solid line only have a small difference before the discharging current $I_S$ falls to 0 and the auxiliary related voltage $V_{AUX}$ varies rapidly due to the resonant effect but the delayed delay signal $V_{PSE}$ does not varies rapidly at the moment that the discharging current $I_S$ falls to 0, such that the voltage difference between the delay signal $V_{PSE}$ and the auxiliary related voltage $V_{AUX}$ is greater than the pre-defined threshold value (e.g. about 0). Therefore, the subtracting signal $V_{SUB}$ can be designed to be the delay signal $V_{PSE}$ minus the auxiliary related voltage $V_{AUX}$ and plus a virtual ground voltage level $V_{VG}$, such that at the moment that the subtracting signal $V_{SUB}$ minus the virtual ground voltage level $V_{VG}$ is greater than the threshold value (i.e. the delay signal $V_{PSE}$ minus the auxiliary related voltage $V_{AUX}$ is greater than the threshold value), the comparing unit 404 determines that the discharging current $I_S$ is 0, and generates the sampling signal $V_{SH}$ in a pulse form. Then, the sample and hold unit 406 samples the delay signal $V_{PSE}$ accordingly to obtains a voltage of the auxiliary related voltage $V_{AUX}$ (i.e. $V_C*k$) at this moment, wherein the specific period of delaying the auxiliary related voltage $V_{AUX}$ to generate the delay signal $V_{PSE}$ is substantially a reacting time during which the subtracting unit 402 generates the subtracting signal $V_{SUB}$ for the sample and hold unit 406 to sample the delay signal $V_{PSE}$, such that the voltage of the auxiliary related voltage $V_{AUX}$ at this moment time can be obtained accurately. As a result, the embodiment can compare the auxiliary related voltage $V_{AUX}$ and the delay signal $V_{PSE}$ on the primary side, to accurately detect the knee voltage $V_C$.

Noticeably, the spirit of the above embodiment is to compare the auxiliary related voltage $V_{AUX}$ and the delay signal $V_{PSE}$ on the primary side, to accurately detect the knee voltage $V_C$, and thus has lower cost and smaller circuit area compared with the conventional secondary side feedback control structure, and is not effected by external elements or does not need to increase the sampling frequency thereby saving power consumption and avoiding electromagnetic interference compared with the conventional primary side feedback control structure. Those skilled in the art can make modifications or alterations accordingly. For example, in the above embodiment, a divided voltage of the auxiliary voltage $V_A$ is utilized as the auxiliary related voltage $V_{AUX}$, but the auxiliary voltage $V_A$ or another voltage related to the auxiliary voltage $V_A$ can be utilized as the auxiliary related voltage $V_{AUX}$ in other embodiments to be delayed to generate the delay signal $V_{PSE}$, which is then for comparison to accurately detect the knee voltage $V_C$.

Figure 6:
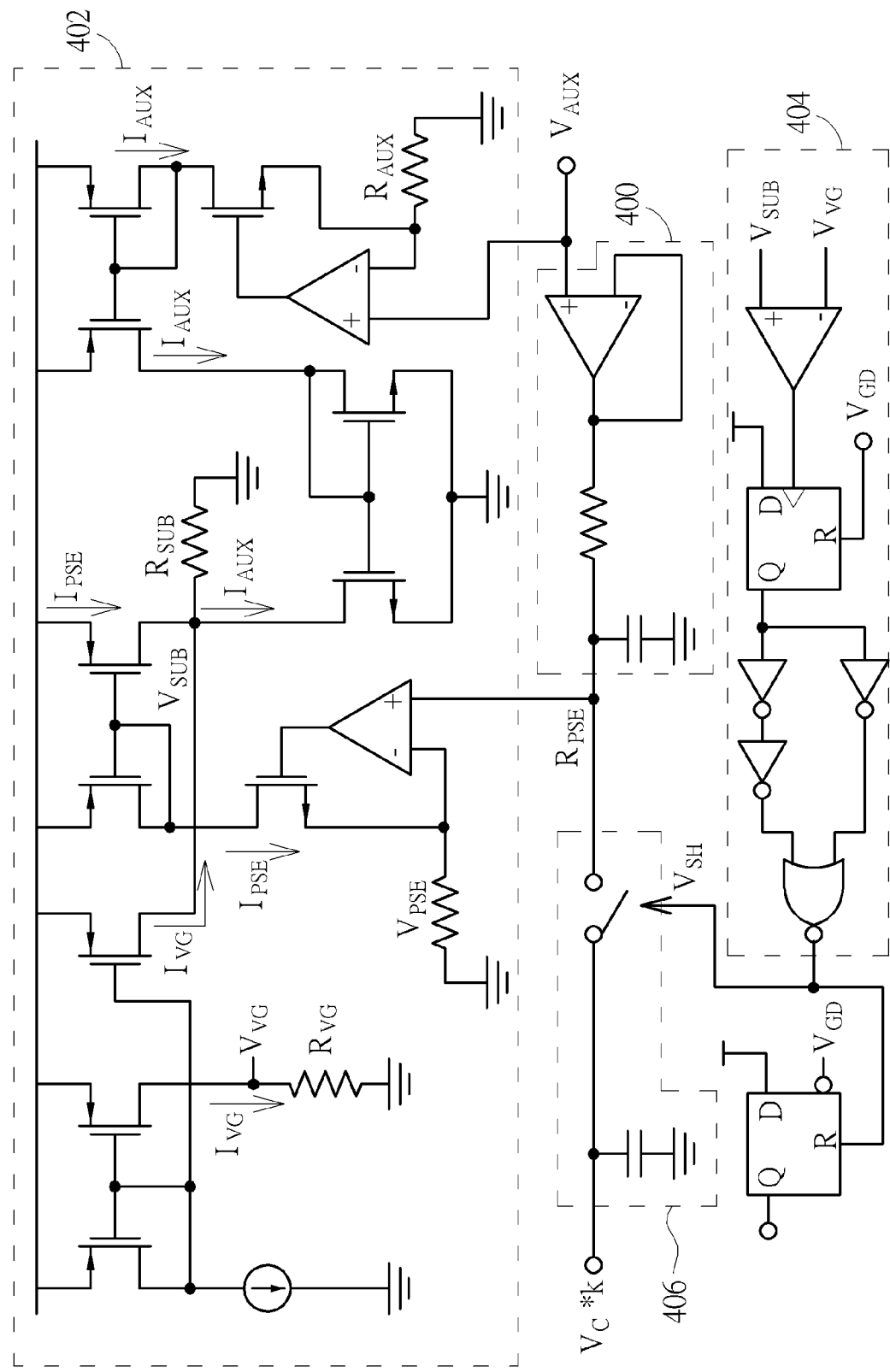
FIG. 6 is a schematic diagram of detailed circuits of the knee voltage detector shown in FIG. 4.

Besides, detailed circuits of the delay unit 400, the subtracting unit 402, the comparing unit 404 and the sample and hold unit 406 of the knee voltage detector 40 are not limited to any form, as long as the above functions can be realized. For example, please refer to FIG. 6, which is a schematic diagram of detailed circuits of the knee voltage detector 40 shown in FIG. 4. As shown in FIG. 6, the delay unit 400 utilizes an operational amplifier to stably output the auxiliary related voltage $V_{AUX}$, and then utilizes a resistor capacitor (RC) delay circuit to delay the auxiliary related voltage $V_{AUX}$ for the specific period, to generate the delay signal $V_{PSE}$. Then, the subtracting unit 402 utilizes an operational amplifier to perform negative feedback and utilizes an auxiliary related resistor $R_{AUX}$ to generate an corresponding auxiliary related current $I_{AUX}$, and then utilizes an operational amplifier to perform negative feedback and utilizes a delay resistor $R_{PSE}$ to generate a corresponding delay current $I_{PSE}$. Afterwards, the subtracting unit 402 utilizes a voltage source and a current mirror to generate a corresponding virtual ground current $I_{VG}$ (the virtual ground current $I_{VG}$ flows through a virtual ground resistor $R_{VG}$ to generate the virtual ground voltage level $V_{VG}$), and then utilizes current mirrors to generate the subtracting signal $V_{SUB}$ which is a current of the delay current $I_{PSE}$ minus the auxiliary related current $I_{AUX}$ and plus the virtual ground current $I_{VG}$ flowing through a subtracting resistor $R_{SUB}$. Noticeably, when the delay signal $V_{PSE}$ minus the auxiliary related voltage $V_{AUX}$ is 0 or a negative value, the delay current $I_{PSE}$ minus the auxiliary related current $I_{AUX}$ is also 0 or a negative value, such that current mirrors cannot operate normally if the delay current $I_{PSE}$ minus the auxiliary related current $I_{AUX}$ as 0 or the negative current is directly compared. Therefore, the virtual ground current $I_{VG}$ is added up to ensure normal operations. But in other embodiments, if a structure of the subtracting unit 402 can directly compare the delay signal $V_{PSE}$ and the auxiliary related voltage $V_{AUX}$, the virtual ground voltage level $V_{VG}$ is not necessary.

Figure 1A:
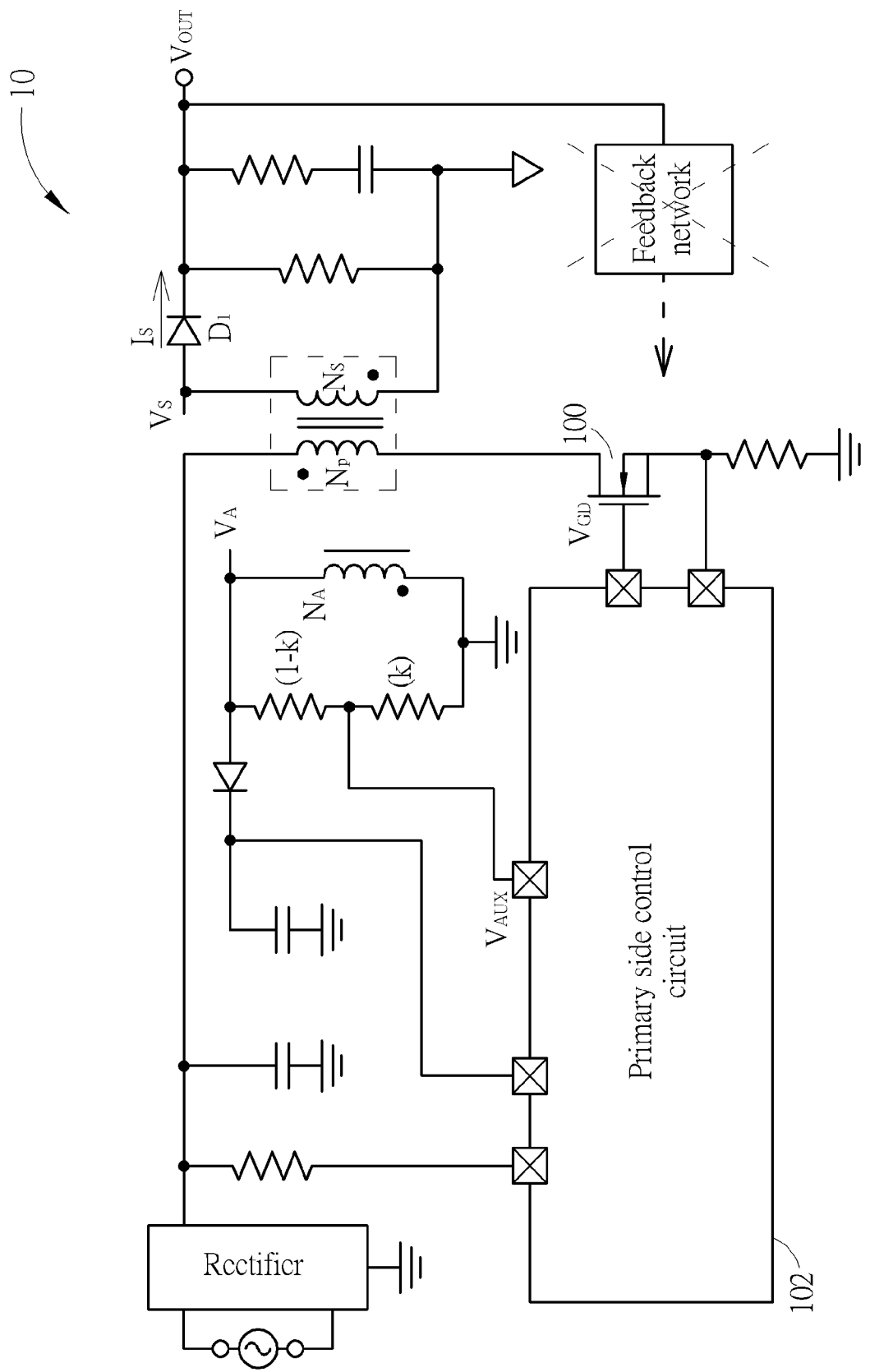
FIG. 1A is a schematic diagram of a primary side control flyback circuit.
Figure 1B:
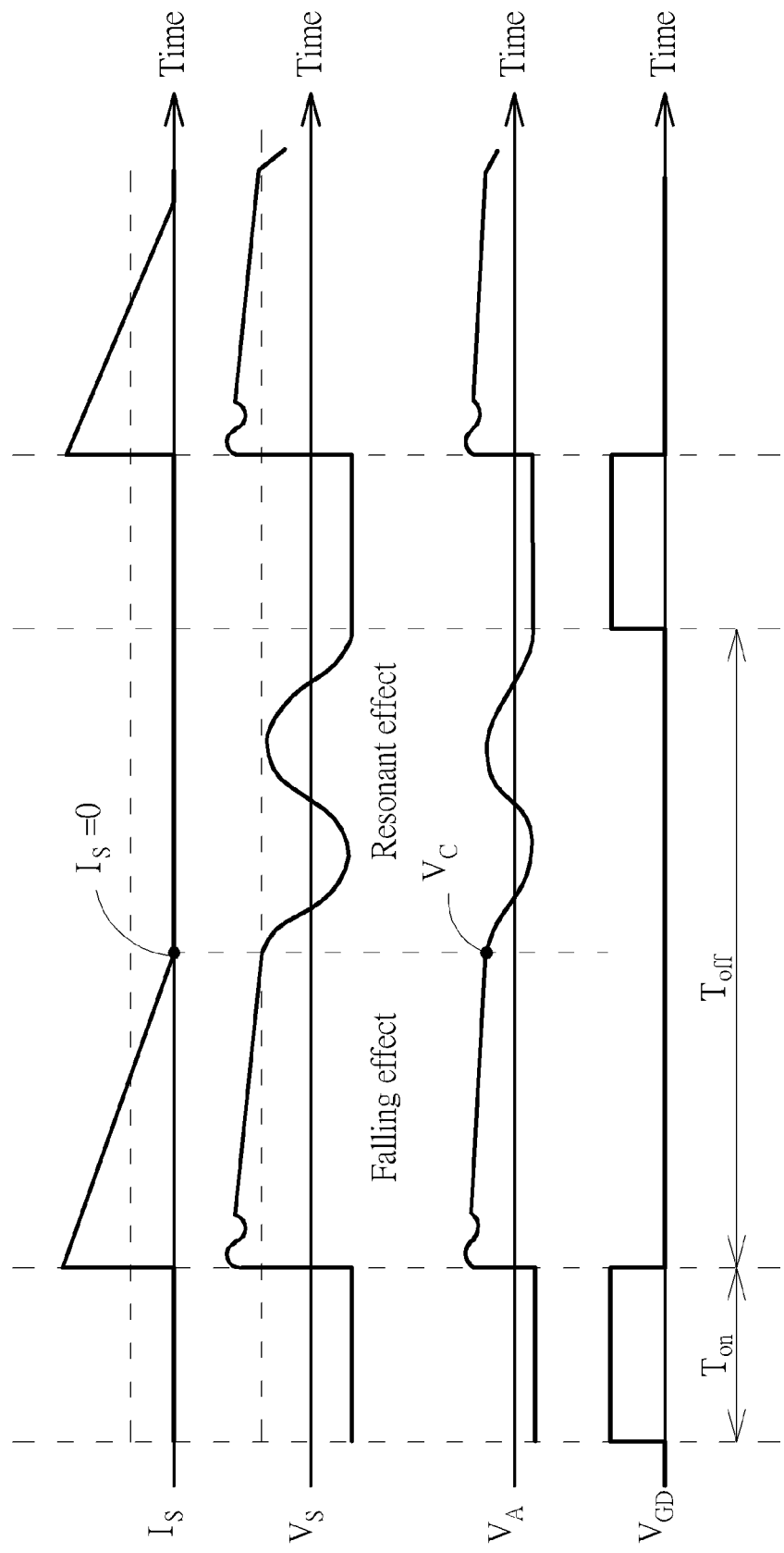
FIG. 1B is a schematic diagram of signals of the primary side control flyback circuit shown in FIG. 1A.
Figure 2:
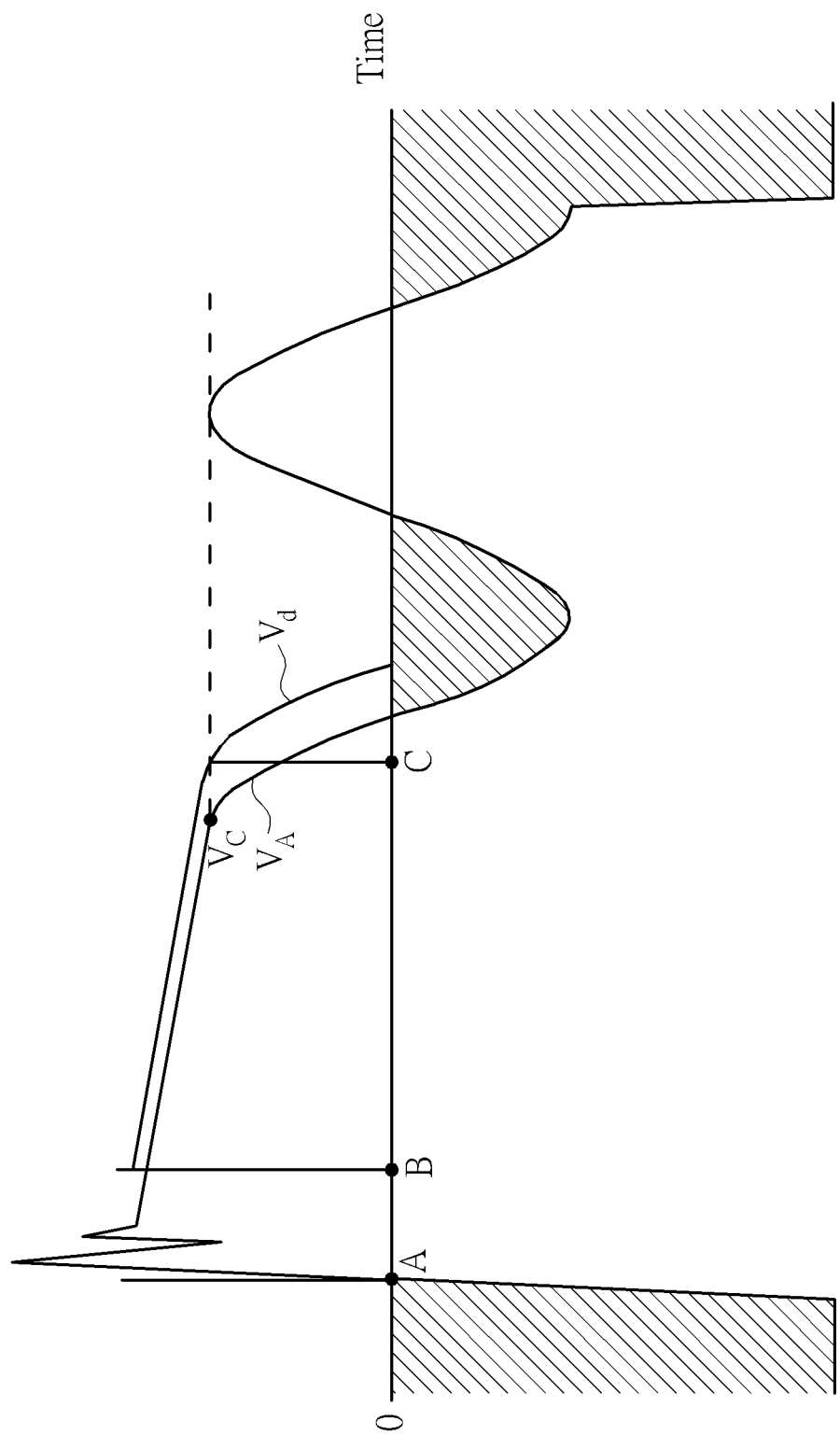
FIG. 2 is a schematic diagram of operations of a conventional detector of a primary side control circuit shown in FIG. LA.
Figure 3:
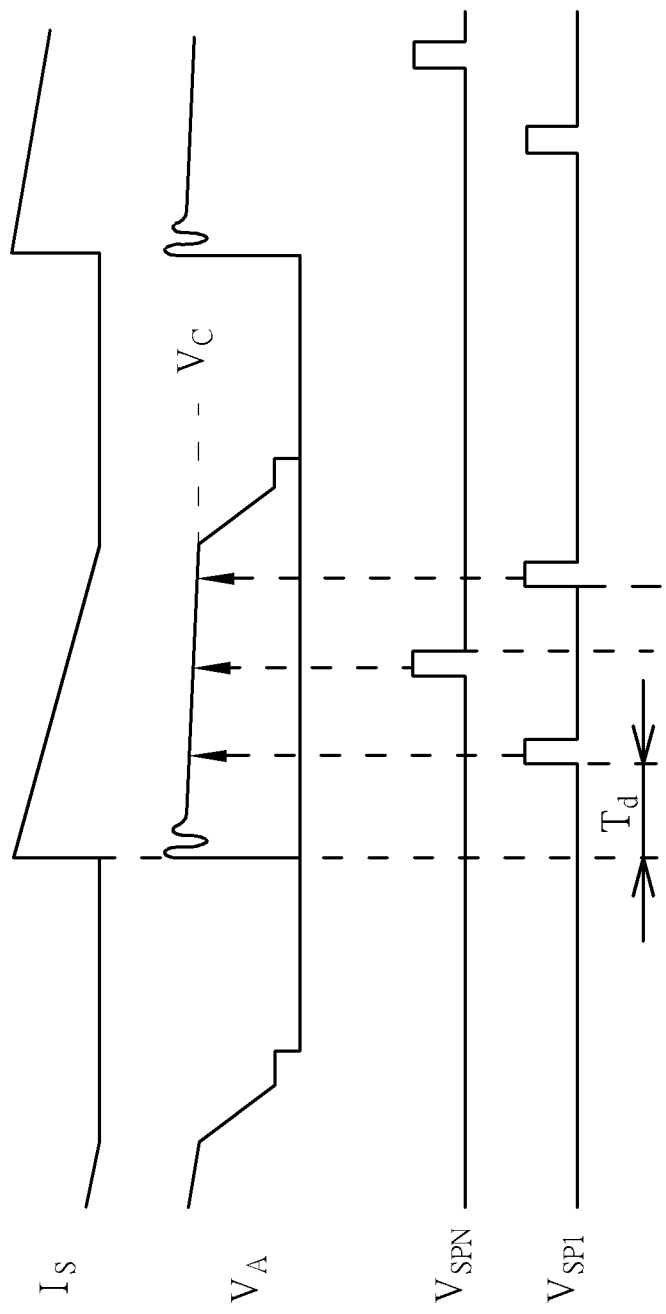
FIG. 3 is a schematic diagram of operations of another conventional detector of the primary side control circuit shown in FIG. 1A.

Then, the comparing unit 404 utilizes a comparator to compare the subtracting signal $V_{SUB}$ with the virtual ground voltage level $V_{VG}$ and generate a comparing result with a high voltage level when the subtracting signal $V_{SUB}$ is greater than the virtual ground voltage level $V_{VG}$. Afterwards, the comparing unit 404 utilizes following logic circuits to generate the sampling signal $V_{SH}$ in a pulse form, and then the sample and hold unit 406 accordingly turns on a switch to take a voltage of the delay signal $V_{PSE}$ at this moment as a voltage of the auxiliary related voltage $V_{AUX}$ (i.e. $V_C*k$) at the moment that the difference value between the delay signal $V_{PSE}$ and the auxiliary related voltage $V_{AUX}$ is greater than the threshold value. Noticeably, the knee voltage detector 40 can further include a blanking circuit (not shown) as shown in operations of the conventional detectors of FIG. 2 and FIG. 3, and thus does not perform detections during a blanking time, to avoid interference due to non-ideal factors. As a result, the embodiment can compare the auxiliary related voltage $V_{AUX}$ and the delay signal $V_{PSE}$ on the primary side via the above circuit structure, to accurately detect the knee voltage $V_C$.

In the prior art, the conventional secondary side feedback control structure includes the optical coupler and the three-terminal shunt regulator, and thus requires high cost and large circuit area, while accuracy of the conventional primary side feedback control structure is effected by external elements otherwise the sampling frequency needs to be increased, thereby increasing power consumption and inducing electromagnetic interference.

In comparison, the embodiment compares the auxiliary related voltage $V_{AUX}$ and the delay signal $V_{PSE}$ on the primary side, to accurately detect the knee voltage $V_C$, and thus has lower cost and smaller circuit area compared with the conventional secondary side feedback control structure, and is not effected by external elements or does not need to increase the sampling frequency thereby saving power consumption and avoiding electromagnetic interference compared with the conventional primary side feedback control structure.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A knee voltage detector, for a flyback converter, comprising:
   a delay unit, for delaying an auxiliary related voltage of an auxiliary winding of the flyback converter for a specific period, to generate a delay signal;
   a subtracting unit, for generating a subtracting signal according to the auxiliary related voltage and the delay signal;
   a comparing unit, for generating a sampling signal when the subtracting signal indicates that a voltage difference between the auxiliary related voltage and the delay signal is greater than a threshold value; and
   a sample and hold unit, for sampling the delay signal to generate a knee voltage according to the sampling signal when the voltage difference between the auxiliary related voltage and the delay signal is greater than the threshold value.

2. The knee voltage detector of claim 1, wherein the delay unit utilizes a resistor capacitor delay (RC delay) circuit to delay the auxiliary related voltage for the specific period, to generate the delay signal.

3. The knee voltage detector of claim 1, wherein the specific period is substantially a reacting time during which the subtracting unit generates the subtracting signal for the sample and hold unit to sample the delay signal.

4. The knee voltage detector of claim 1, wherein the threshold value is substantially 0.

5. The knee voltage detector of claim 1, wherein the subtracting unit subtracts an auxiliary related current corresponding to the auxiliary related voltage from a delay current corresponding to the delay signal, to generate the subtracting signal.

6. The knee voltage detector of claim 1, wherein the subtracting signal is the delay signal minus the auxiliary related voltage and plus a virtual ground voltage level.

7. The knee voltage detector of claim 1, wherein the comparing unit generates the sampling signal in a pulse form when the subtracting signal indicates that the voltage difference between the auxiliary related voltage and the delay signal is greater than the threshold value.

* * * * *